United States Patent [19]

Miller

[11] Patent Number: 4,835,416
[45] Date of Patent: May 30, 1989

[54] $V_{DD}$ LOAD DUMP PROTECTION CIRCUIT

[75] Inventor: William E. Miller, Los Gatos, Calif.

[73] Assignee: National Semiconductor Corporation, Santa Clara, Calif.

[21] Appl. No.: 91,851

[22] Filed: Aug. 31, 1987

[51] Int. Cl.[4] .................. H02H 9/00; H02H 3/24; H02H 3/20; H01L 29/78

[52] U.S. Cl. ..................... 307/296.4; 307/542; 307/594; 361/56; 361/91; 361/111; 357/23.13

[58] Field of Search .............. 307/296 R, 200 B, 264, 307/592, 593, 594, 360, 363, 570, 571, 450, 491, 494, 296.5, 542; 357/23.13; 361/190, 91, 56, 111

[56] References Cited

U.S. PATENT DOCUMENTS

| | | | |
|---|---|---|---|
| 4,334,256 | 6/1982 | Mings | 361/56 |
| 4,484,244 | 11/1984 | Avery | 361/111 X |
| 4,589,049 | 5/1986 | Krumein | 361/91 X |
| 4,605,980 | 8/1986 | Hartranft et al. | 361/91 X |
| 4,698,529 | 10/1987 | Asami | 307/594 X |
| 4,698,720 | 10/1987 | Finaurini | 361/91 |
| 4,703,388 | 10/1987 | Ruhnau | 361/91 |
| 4,710,791 | 12/1987 | Shirato et al. | 361/91 X |
| 4,745,450 | 5/1988 | Hartranft et al. | 361/91 X |

OTHER PUBLICATIONS

Baker, "Buffer Circuit for Line Driver Protects Against Shorts and ±325 Volts Surges", *Electronic Design*, (23), pp. 102-104, Nov. 8, 1977.

Primary Examiner—Stanley D. Miller
Assistant Examiner—David R. Bertelson
Attorney, Agent, or Firm—Limbach, Limbach & Sutton

[57] ABSTRACT

The present invention provides power supply load dump protection circuitry for insuring that supply voltages that are applied to the supply pad of a low current logic circuit and which exceed a preselected voltage level are prevented from damaging the logic circuit and also from appearing at an output of the logic circuit. Three circuit areas are protected. An integrated 5V regulated supply circuit is protected by connecting the supply pad to a polysilicon resistor in series with the source of the p-channel MOS output pull up transistor of the regulator circuit, the drain of the driver being connected to the 5V regulated supply pad. 16V low current logic circuits associated with the input pads, output pads and the 5V regulator are protected by connecting the supply pad to a large value polysilicon resistor in series with the power supply pads of these circuits. 16V high current output signal circuits are protected by connecting the supply pad to the source of the p-channel MOS output pull up transistor of the output circuit, with its drain being connected to the output pad. Each of the p-channel MOS transistors has its gate connected to a detection circuit which, upon detection of load dump transients, turns them off. All of the above-described transistors and resistors, are designed to withstand maximum load dump transients.

14 Claims, 4 Drawing Sheets

- e  FREE ELECTRON
- ⊖  FIXED ION (BORON)
- +  FREE HOLE
- ⊕  FIXED ION (PHOSPHORUS)

$V_{DD}$ LOAD DUMP PROTECTION CIRCUIT

BACKGROUND OF THE INVENTION

1. Field of the Invention

The present invention is directed to circuitry for on-chip protection against power supply load dump transients, to the structure of the devices utilized in such circuitry, and to methods for fabricating these structures.

2. Discussion of the Prior Art

Integrated circuit devices are easily damaged by power supply transients unless protection circuitry is provided. One of the most severe conditions to be protected against is known as "automotive load dump". This condition can be described in conjunction with the graph provided as FIG. 1.

As is well known, in the basic configuration of an automotive electrical system, a battery and an alternator are connected in parallel to the input $V_{DD}$ power supply pad of the various operative low current logic circuits in the system. The alternator is capable of generating a large current to charge the battery and to supply the other automotive loads. A "load dump" event occurs when the alternator's load is disconnected, for example when a battery connector comes loose or, in a less severe example, when the automobile's headlights are turned off. Because of the current flow through the alternator and its inherent inductance, a magnetic field is established which prevents the alternator's output current from changing rapidly. When the alternator's load is suddenly reduced, charge, and thus voltage, builds up at the $V_{DD}$ power supply pad of the operative circuits, which remain connected to the alternator's output.

As illustrated in FIG. 1, a sudden voltage increase, or "load dump transient", is applied to the $VV_{DD}$ supply pad at the time of the upset, $t=0$. This transient, which can be expressed as $$V_{DD} = 14 + 46e^{-t/120} \text{ msec.}$$

for the typical automotive system, is quite high close to the battery and decreases with distance from the battery. For example, the transient voltage might reach 80V in the engine compartment, 60V along the firewall and 40V in the passenger compartment.

The logic circuits in the system must, obviously, remain in their normal operating mode up to a $V_{DD}$ supply voltage of 16V. However, if the $V_{DD}$ supply voltage rises above 16V, such as in the event of a load dump transient, disruption of the circuit's normal operation is permitted, but no permanent damage can result within the circuit and it must not pass greater than 20V to other circuits in the system via its outputs. When, as shown in FIG. 1, the $V_{DD}$ supply voltage returns to less than 16V with time, the circuit must return to normal operation.

The conventional approach to solving the problem of load dump transients has been to provide an arrangement of external passive components between the power supply and the supply pad of the operative circuit. This typically takes the form of an external network of resistors and capacitors which serves as a filter for the voltage surge. Alternatively, an external inductor is inserted in series with the operative circuit to resist the changing current caused by the transient. These solutions require extra components, which increase cost, and consume valuable space within the system.

SUMMARY OF THE INVENTION

According to the present invention, protection circuitry is integrated with operative low current logic circuitry such that the operative circuitry can experience a $V_{DD}$ power supply transient, recover, and then return to normal operation without suffering permanent damage. Additionally, the protection circuitry insures that the transient voltage does not traverse the operative circuitry to be passed by its output lines to the system databus. Further protection is provided for an integrated voltage regulator and for on-chip level shifting circuitry which provide an interface with the 16V $V_{DD}$ supply levels and 16V external logic signal levels.

The protection circuitry of the present invention utilizes junction-isolated CMOS device technology. Devices having gate oxides approximately 1000 Angstroms thick are utilized to provide the interface to a 9-16V automotive power supply and signal lines. Devices having gate oxides approximately 400 Angstroms thick are utilized to provide 5V logic and processing circuitry; these devices are powered by the integrated 5V regulator. Voltage reducing devices are connected between the $V_{DD}$ supply pad of the operational circuit and the remainder of the operational circuit to limit the voltage and current passed to the operational circuit.

Thus, as stated above, three integrated circuit areas are protected from load dump transients. First, the integrated 16V low current logic circuits are protected by connecting the $V_{DD}$ supply pad to large value polysilicon resistors in series with the power supply nodes of these circuits. Second, the integrated 16V high current output signal circuits are protected by connecting the $V_{DD}$ supply pad directly to the source of the p-channel MOS output driver of the output circuit, the driver's drain being connected to the output signal pad. Third, the integrated 5V regulated supply circuit is protected by connecting the $V_{DD}$ supply pad to a polysilicon resistor in series with the source of the p-channel MOS output driver of the regulated circuit, the drain of the output driver being connected to the 5V regulated supply pad.

Each of the p-channel MOS driver transistors has its gate connected to an integrated supply voltage detection circuit which, upon detection of supply levels greater than 16V, shorts the gate of the driver to its source to turn it off. The gate of each of these devices is also connected to the normal operational control logic through series, high-value, N-well diffused resistors.

All of the above-described transistors and resistors are uniquely designed to withstand maximum load dump voltage and current transients, yet are fabricated in the course of normal process flow.

Thus, it is a primary object of the present invention to provide integrated protection against power supply load dump transients.

It is also an object of the present invention to provide integrated protection circuitry utilizing a unique application of conventional processing techniques.

It is a further object of the present invention to provide integrated protection both against power supply transients for internal operative circuitry as well as against passage of the transient voltage to the outputs of the internal circuitry.

These and other objects, advantages and features of the load dump protection circuitry of the present invention will be better understood and appreciated by reference to the detailed description of a preferred embodiment of the invention provided below which should be considered in conjunction with the accompanying drawings.

DETAILED DESCRIPTION OF THE INVENTION

Figure 1:
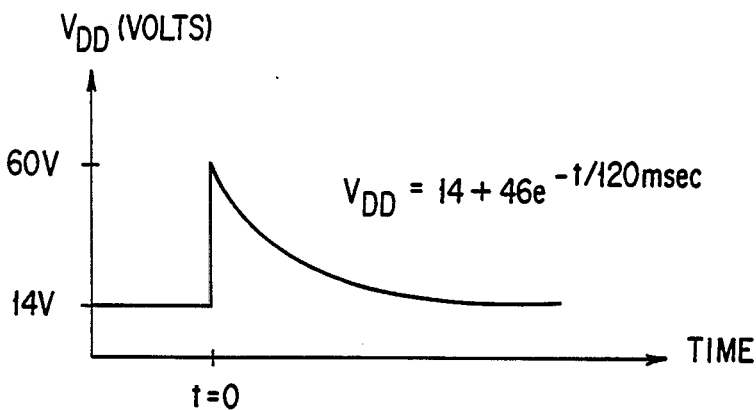
FIG. 1 is a graph illustrating voltage versus time during a power supply load dump transient.
Figure 2:
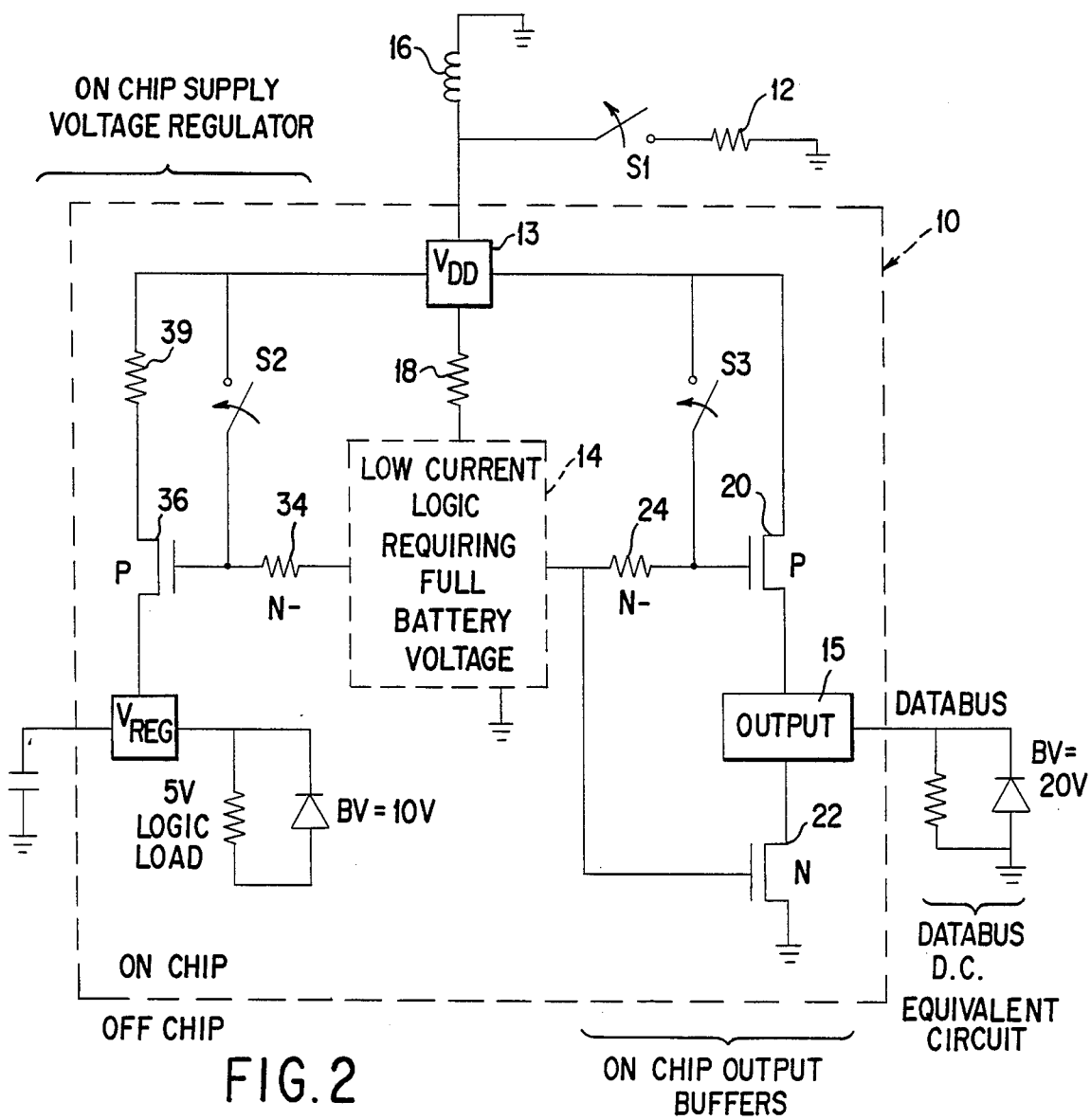
FIG. 2 is a simplified schematic diagram illustrating a preferred embodiment of an integrated load dump protection circuit in accordance with the present invention.

FIG. 2 shows an automotive load 12, such as an automobile battery, connected through switch S1 to the $V_{DD}$ supply pad 13 of an integrated circuit 10. An alternator power supply 16 is also connected to the supply pad 13. The opening of switch S1 represents the occurrence of an operational upset which causes a power supply load dump transient of the type illustrated in FIG. 1.

Connected between the $V_{DD}$ supply pad 13 and a low current logic circuit 14 are 2KΩ polysilicon resistors 18. While polysilicon resistors 18 are illustrated in FIG. 2 as a single resistor, it should be understood that they may be a plurality of parallel-connected resistors, each such resistor being connected to a separate logic circuit.

In automotive applications, the low current logic circuit 14 swings from voltage levels from 0V up to normal battery voltage, which at a maximum is 16V. The voltage drop across resistors 18 during normal operation will be small because logic circuit 14 requires very low current to operate under normal conditions. However, when, as shown in FIG. 1, the $V_{DD}$ supply voltage rises to approximately 60V during a transient event, the resistors 18 drop most of the transient voltage to protect the devices in circuit 14.

Thus, in accordance with a first aspect of the present invention, 2KΩ polysilicon thin film resistors 18 are provided in series with the $V_{DD}$ supply voltage pad 13 to protect and supply the low current logic circuit 14. As stated above, resistors 18 serve to limit the supply current to logic circuit 14 during power supply transients. Under normal operation, poly resistors 18 will pass less than 50 microamps each and drop less than 100 millivolts.

Resistors 18 are fabricated to be large enough so as not to burn out during a power supply load dump transient. Because they are fabricated over field oxides having a thickness of 6-12K Angstroms, resistors 18 have approximately 60-120V isolation from the remainder of the logic circuit 14. The required sizes of resistors 18 for the illustrated application are easily realized at 2μ×200 μm.

The output inverter which drives the output pad 15 of logic circuit 14 presents a more difficult design problem, since it must be a low resistance driver. For example $$\frac{V_{DD} - V_{OH}}{I_{OH}} < \frac{1V}{10ma}$$

or $<100\Omega$ resistance.
where
$V_{OH}$=output voltage at pad 15 and
$I_{OH}$=output current at pad 15.

It is impractical to use polysilicon resistors of the type described above in series with the $V_{DD}$ supply voltage on each output driver, since the logic circuit 14 typically has many outputs and these large size poly resistors would also enlarge the output driver devices which together would occupy a very large chip area.

Thus, in accordance with a second aspect of the present invention, load dump protection circuitry is provided which detects the power supply transient voltage and prevents it from reaching the output pad 15 of integrated circuit 10.

When a power supply transient occurs, that is, when switch S1 opens, the $V_{DD}$ supply immediately rises (as shown in FIG. 1). When normally-open switch S3 detects the transient, it closes, thus shorting the gate of driver 20 to its source and turning off driver 20. If switch S3 was not present, the load dump voltage would turn on the p-channel output device 20 and full load dump current would be passed through device 20. This current would be large enough to destroy both the output device 20 and the n-channel output device 22; it would also potentially destroy components off-chip on the databus, which would become low resistive at greater than 20V, the current passing on the databus under these conditions being $$I_O = \frac{60V - 20V}{<100\Omega} > 40 \text{ ma}.$$

As stated above, and as will be described in greater detail below, the present invention provides a detection circuit which turns off the output driver 20 and maintains all bipolar parasitic devices off during a load dump transient wherein $20V \leq V_{DD} \leq 60V$, and then returns the output driver 20 to normal operation when the $V_{DD}$ supply voltage returns to less than 17V.

The databus associated with circuit 10 is required to be pulled up to full battery voltage during normal operation of the integrated circuit 10. To accomplish this, the output driver 20 is rated at 20V operation under normal conditions. However, as will be described in greater detail below, driver 20 is also capable of withstanding the high voltages generated during power supply transient conditions.

As stated above, in accordance with a third aspect of the present invention, output driver 20 is constructed so that it can withstand a 40V breakdown voltage between its source and drain with its gate off, and a 60V breakdown voltage between its source and the $V_{SS}$ grounded silicon substrate. This is accomplished by providing a unique p-channel, N-well MOS device design which is used to pull up the output pin 15. A conventional n-channel MOS device 22 is used to pull down the output pin 15. Both device 20 and device 22 are fabricated to have approximately 1000 Angstrom gate oxide thickness to provide a breakdown voltage $BV_{DSS}$ approximately equal to 20V. In addition, as will be explained in greater detail below, the breakdown voltage of p-channel device 20 will walk out to approximately 42V due to hot electron injection into the gate oxide near the drain-to-body avalanche breakdown area.

Figure 3:
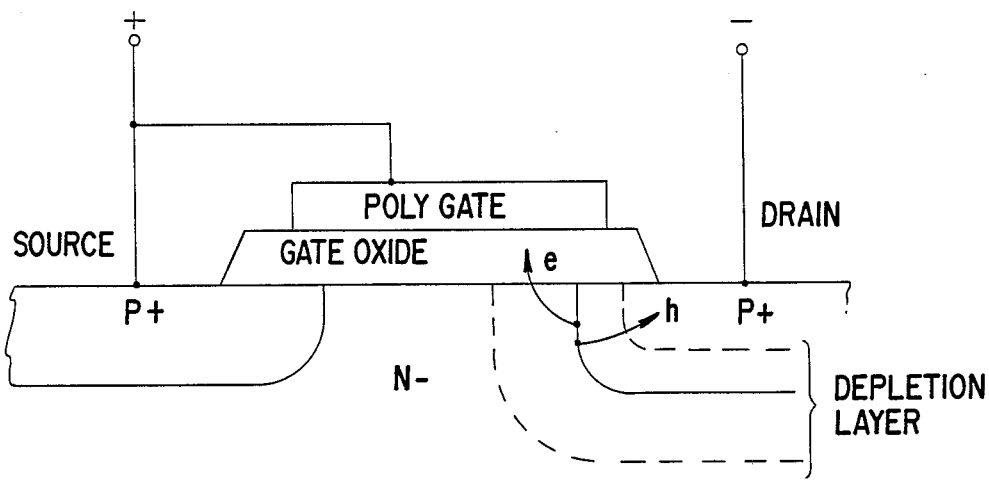
FIG. 3 is a cross-sectional view illustrating a p-channel device structure of the type used in the load dump protection circuit shown in FIG. 2.

Referring to FIG. 3, it is a well known phenomenon that hot electrons "e" will charge the gate oxide of a field effect transistor and reduce the electric field strength in the depletion layer, allowing the breakdown voltage $BV_{DSS}$ to increase. Due to this effect, the output driver 20, when turned off by the special load dump protection circuitry represented by switch S3, will stand off a drain/source voltage $V_{DS}$ of approximately 42V so that the output voltage $V_{OUT}$ will be less than or equal to $60V - 42V = 18V$.

More specifically, as shown in FIG. 3, as the voltage difference across the source and drain of device 20 increases, the depletion layer, which by definition is a region that contains no free charge carriers, grows larger to hold off the increasing voltage. This results in the creation of an electric field because the free carriers are stripped out and ionized dopant atoms remain. Thus, the P+ region has holes "h" as free carriers which are stripped and negative boron ions which remain. Conversely, in the N− region, the electrons are stripped by the high source/drain potential and positive phosphorous ions remain. This creates positive charge in the N− region and negative charge in the P+ region and produces a large electric field across the junction between the two. As the $V_{DD}$ supply voltage increases, the electric field becomes stronger to the point where electrons "e" are physically torn away from the silicon host material. At this point, the electrons become free to move in the electric field. Because the polysilicon gate of device 20 is tied to a positive potential and the electrons are attracted to a positive potential, the free electrons "e" quickly drift upward toward the poly gate. Thus, the free electrons enter the gate oxide across the potential barrier and provide a negative charge to the gate oxide. This negative charge increases the avalanche breakdown voltage $BV_{DSS}$ of the junction.

Figure 4:
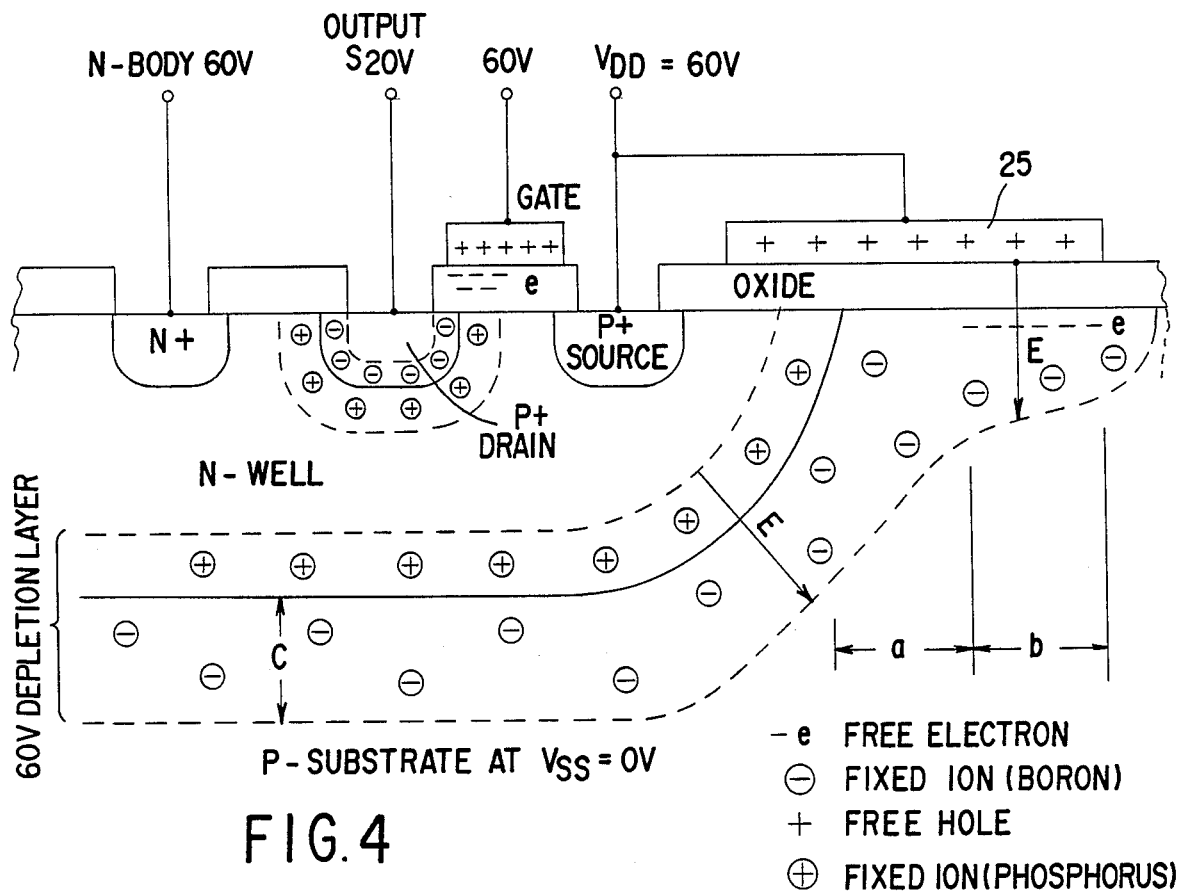
FIG. 4 is a cross-sectional view illustrating further detail of a field plate for a p-channel device structure of the type utilized in the load dump protection circuit shown in FIG. 2.

Also, the MOS fabrication process utilized to construct the circuit results in bipolar parasitic devices which are able to withstand 60V reverse bias from the $V_{DD}$ nodes (P+ and N−) to the $V_{SS}$ node (P−), as shown in FIG. 4.

In conventional designs, p-channel output drivers have an N+ guard ring fabricated around the device to prevent an inversion from forming when high voltages occur on the I/O pins. According to a fourth aspect of the present invention, and as shown in FIG. 4, the p-channel channel output driver 20 has a field plate 25 fabricated around it. This field plate 25 is tied to the highest potential present in the output buffer (i.e., the N-well) and, therefore, an inversion channel will not form in the N− area. Also, as described below, the avalanche breakdown voltage of the N-well/P-substrate junction is increased to greater than 60V by the presence of the field plate 25.

The field plate phenomenon illustrated in FIG. 4 makes the N-well/P-substrate junction appear to be planar, when in fact it is curved. The curvature of the junction lowers the breakdown voltage because the electric field is stronger in the curved region. Thus, placing positive charge out over and beyond the PN junction extends the negative potential and, in effect, increases the radius of curvature of the junction.

Thus, in accordance with the present invention rather than injecting carriers as shown in FIG. 3, the field plate 25, which is the same positive potential as the N-well, is physically extended over the junction to increase the avalanche breakdown voltage. Conversely, the effect of placing a negative potential on field plate 25, i.e., tying it to the substrate potential, would make the junction appear as if it physically curves back in. That is, the electric field intensity is reduced by the field plate 25 if it is tied to the diffused N-well region; the electric field intensity is increased if the field plate is tied to the substrate.

Thus, three conditions are met in the design of the output driver 20 to maintain isolation between the N-well and the P-substrate at 60V bias. First, the parasitic bipolar transistors are kept off by absence of base drive voltage. Second, the N− diffusion sufficiently overlaps the P+ diffusion, both vertically and horizontally, to prevent punch through breakdown. Third, the substrate doping is light enough and the field plate 25 described above overlaps the PN junction sufficiently to prevent avalanche breakdown. In general, and in accordance with the present invention, the field plate concept is utilized both in the logic circuit and in the protection circuitry any time an N-well resistor or a P-channel, N-well device is susceptible to having 60V applied to it.

Under load dump transient conditions, the action of the field plate 25 is as shown in FIG. 4. The field plate overlap of the N- well is "a+b". A potential of $60V - 2\phi_b = 59.4V$ is present across the distance "a" on the silicon surface. Area "b" on the silicon surface is at potential $2\phi_b = 0.6V$. As the overlap is reduced, area "b" goes to 0 distance. Then area "a" decreases. When area "a" decreases, the PN breakdown voltage decreases. For maximum PN breakdown voltage, a=c, where "c" is the thickness of the depletion layer into the P-substrate beneath the N-well diffusion. The free electrons formed under the field plate 25 when a+b>c are held captive by the electric field E originating from the polysilicon field plates and do not flow since they are isolated from current sources by the oxide and the depletion layer.

Figure 5:
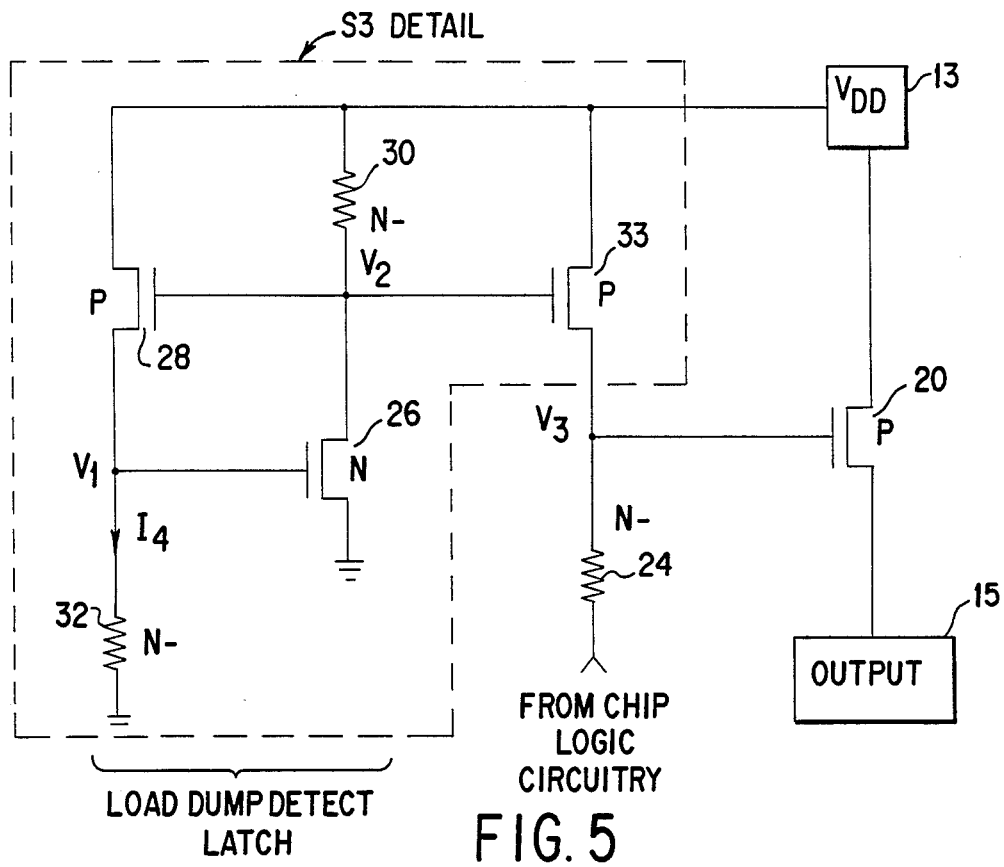
FIG. 5 is a schematic diagram illustrating an integrated load dump detect latch which turns off a logic circuit output driver in accordance with the present invention.

An embodiment of circuitry which detects the load dump transient and turns off the p-channel output driver 20 is shown in FIG. 5. In FIG. 5, p-channel device 20, switch transistor 33 (which is identified as switch S3 in FIG. 2) and 40KΩ resistor 24 correspond to similarly identified components in FIG. 2.

As stated above, to turn off the p-channel output driver 20 requires that switch 33 be closed. In the context of the circuit shown in FIG. 5, this means that the detector circuit comprising resistor 32, transistor 28, resistor 30 and transistor 26 must generate a voltage at Node V2 which activates the gate of switching transistor 33. Thus, components 26, 28, 30 and 32 are configured to form a simple latch which is controlled by the $V_{DD}$ supply voltage. When the $V_{DD}$ supply voltage goes high, transistors 26 and 28 turn on. When the $V_{DD}$ supply voltage drops back down to a safe level, i.e. less than 17V, transistors 26 and 28 turn off.

The latch may be thought of as two inverters, a PMOS inverter and an NMOS inverter, in a loop with the output of the n-channel inverter being provided to the gate of switching transistor 33.

As shown in FIG. 5, when the $V_{DD}$ supply voltage rises above the avalanche breakdown voltage of transistor 26 ($BV_{DSSN} \sim 18V$ with 1000 Angstrom gate oxide and with long Leff, transistor 26 has no snap back on its $I_D$ vs. $V_{DSS}$ curve), then Node $V_2$ *l is clamped at* $BV_{DSS}=18V$. If the $V_{DD}$ supply voltage rises above $BV_{DSSN}+|V_{TP}|$ 19V, then transistors 28 and switch 33 turn on. As switching transistor 33 turns on, output driver 20 turns off preventing excess load dump voltage on the output pad 15. If the output voltage $V_{OUT}$ was permitted to exceed 18V, then the n-channel output driver device (device 22 in FIG. 2) and external components on the databus could be damaged.

The devices in the load dump detect latch shown in FIG. 5 are sized so that when $V_{DD}$ is less than or equal to 18V, the latch transistors 26 and 28 will be off, i.e. draw no quiescent current, and switching transistor 33 will be off. This is required so that normal operation of driver 20 occurs when the $V_{DD}$ supply voltage is less than 18V. To accomplish this, $I_4 R_{32}$ is designed to be less than or equal to $V_{T26}$ when $V_{DD}$ is less than 18V so that transistor 26 will be off and Node $V_2=V_{DD}$. This is realized with resistor $32=40K\Omega$, transistor 28 W/L=30/70 and $V_{T26}=1.7V$. Also, resistors 24, 32 and 30 are all designed to withstand 60V by using N-well and field plates as described above in conjunction with FIG. 4.

During transient conditions, transistor 26 experiences avalanche breakdown. That is, when the $V_{DD}$ supply voltage applied to transistor 26 gets too high, current begins to flow through resistor 30. This turns on transistor 28. In turn, transistor 28 being on allows current flow through resistor 32 which turns on transistor 26. All of this was initiated by the avalanche breakdown of transistor 26. Resistor 30 limits the current so that transistor 26 is not destroyed, but forces the latch to turn on and switch transistor 33 on. Conversely, when the $V_{DD}$ supply voltage returns to normal, i.e. less than 17V, the voltage across resistor 32 goes low, turning off transistor 26, which resets the latch and turns off switch transistor 33.

The advantage of implementing the load dump detect latch utilizing transistor 28 and resistor 32 rather than deleting them, is that when the gate of transistor 28 is clamped at 18V by $BV_{DSS}$ of transistor 26, and the $V_{DD}$ supply voltage and the source of transistor 28 rise to greater than $BV_{DSS}$ of transistor 26, plus 18V, then Node $V_2$ will be set by the latch to 0V. This will occur on the rising edge of a load dump transient greater than 36V. The latch will then hold Node $V_2$ at 0V until the $V_{DD}$ supply voltage becomes less than 18V on load dump. With the full latch, transistor 20 is turned off, $I_{OUT}$ is approximately 0 and $V_{OUT}$ is less than 20V during the entire time of a load dump of magnitude greater than or equal to 36V (at time t=0).

When load dumps of magnitude less than 36V (at time t=0) occur, the latch will not be set, but Node $V_2$ will be held at the $BV_{DSS}$ equal to 18V of transistor 26. Switch 33 will be opened and be capable of pulling $V_3$ greater than $V_{DD}-|V_{TP}|$ so that output driver 20 is off, as explained below and illustrated in FIG. 6.

Figure 6:
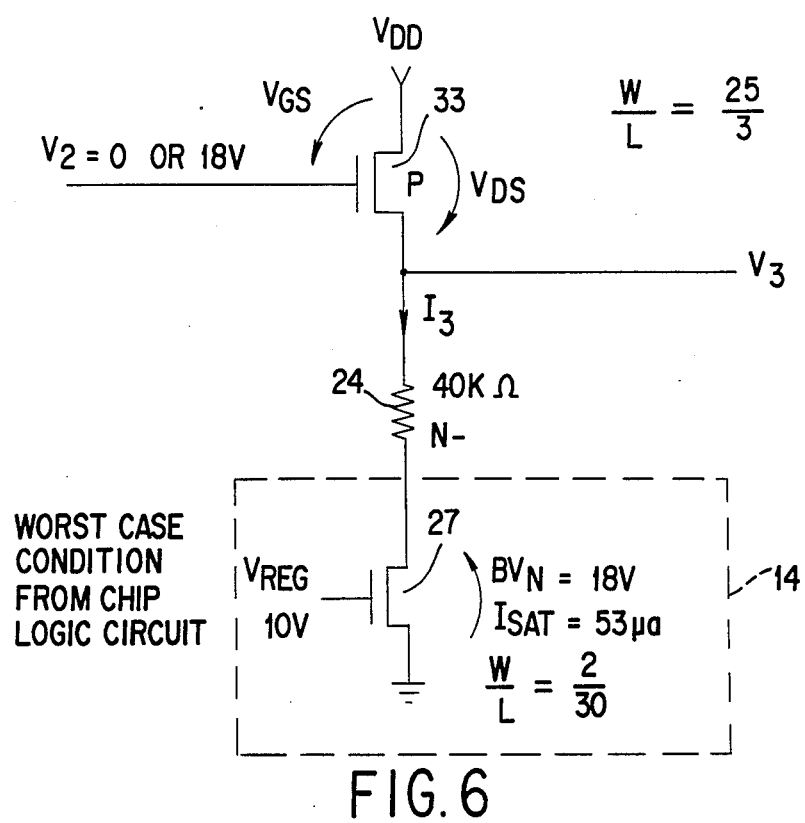
FIG. 6 is a schematic diagram illustrating an analysis of the gate voltage of the P-channel MOS driver transistor during load dump.

FIG. 6 provides a schematic illustration of the operation and w/L ratio for device 33 of the load dump protection circuit for output transistor 20 with test model values. Circuit operation can be calculated using the following equation (where $V_{DS}$, $V_{GS}$ and $V_{TO}$ are all negative values) and results are provided in Table 1 below:

$$\beta \frac{W}{L} V_{DS} \left( V_{GS} - V_{TP} - \frac{V_{DS}}{2} \right) =$$

$$I_3 = \frac{V_{DD} + V_{DS} - BV_N}{R_{24}}$$

which can be rearranged for solution of $V_{DS}$ $$V_{DS} = \frac{V_{DD} - BV_N}{1 - \left[ R_{24} \frac{\beta W}{L} \left( V_{GS} - V_{TP} - \frac{V_{DS}}{2} \right) \right]}$$

where $\beta = 7 \times 10^{-6}$ amp/V$^2$ $V_{TP} = -1V$

Transistor 20 will be off when $V_{GS20} = V_{DS33} > 1V = V_{TP}$.

TABLE 1

| Peak $V_{DD}$ | $V_2$ | Peak $V_{DS}$ | Peak $I_3$ |
|---|---|---|---|
| 60 V | 0 V | −.30 V | 1043 μa |
| 36 V | 0 V | −.22 V | 445 μa |
| 35 V | 18 V | −.45 V | 413 μa |
| 25 V | 18 V | −.48 V | 163 μa |
| 21 V | 18 V | −.61 V | 60 μa |
| 20 V | 18 V | −.86 V | 29 μa |

When $I_3$ is greater than 53 ua, which is the saturation current of transistor 27, then transistor 27 will be in avalanche breakdown.

Figure 7:
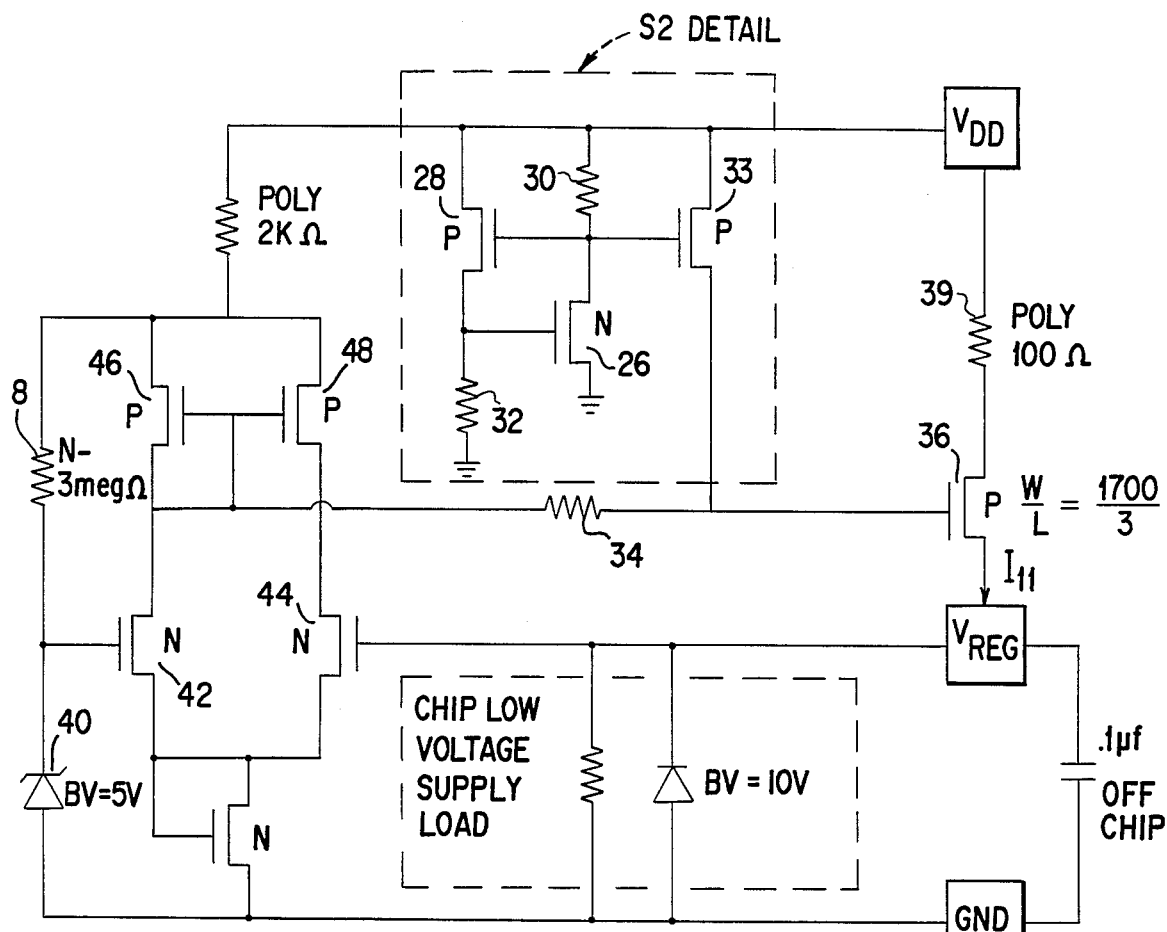
FIG. 7 is a schematic diagram illustrating an integrated load dump protection circuit for a supply voltage regulator in accordance with the present invention.

As shown in FIG. 7, the present invention also provides power supply load dump protection for an on-chip supply voltage regulator. The supply voltage regulator circuit relies on the same load dump detect latch and switch circuit as used for the output driver 20, as described above.

The purpose of the on-chip voltage regulator is to drop the voltage from the $V_{DD}$ supply level, which is operating at about 9–16 volts from the battery, to 5V as a supply for the integrated 5V logic load.

In addition to the load dump detector and latch (i.e. components 26, 30, 28 and 32) switching transistor S2 and isolation resistor 34, a 100Ω poly resistor 39 is added in series with the voltage regulator output driver 36. Resistor 39 is required since the output voltage $V_{REG}$ cannot be allowed to go above 10V due to the low avalanche breakdown voltage of the 400 Angstrom gate oxide devices utilized in the low voltage portion of the circuit. Thus, given the maximum 10V requirement on the regulator and the $V_{DS}=40V$ limitation of p-channel device 36 due to its $V_{DS}$ walk out as described above, the resistor 39 handles the additional 10V of the 60V transient. This is illustrated in FIG. 8.

Referring again to FIG. 7, 3MΩ resistor 38 supplies a small current through zener diode 40 to maintain a 5V reference voltage at the gate of n-channel device 42. N-channel devices 42 and 44 in conjunction with p-channel devices 46 and 48 function as a comparator circuit to maintain the voltage $V_{REG}$ at the same level as the voltage of the gate of device 42. Since the gate of n-channel device 44 is tied to the voltage $V_{REG}$, the gates of both n-channel device 42 and n-channel device 44 are maintained at 5V. Thus, if voltage $V_{REG}$ goes to high, the regulator output voltage applied to the gate of p-channel device 36 tends to turn device 36 off.

Figure 8:
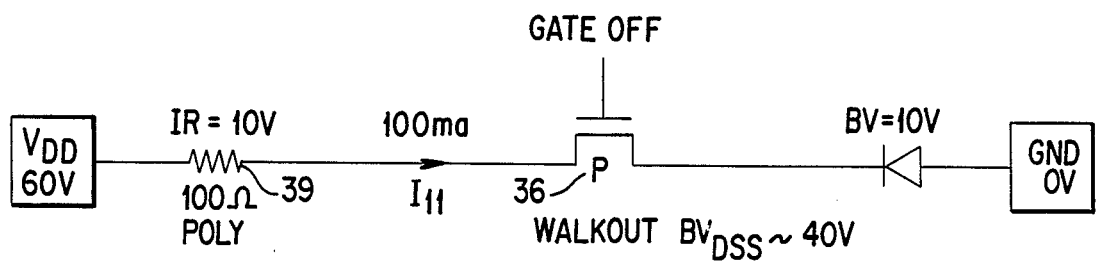
FIG. 8 is a schematic diagram illustrating an analysis of load dump current in the supply voltage regulator shown in FIG. 7.

The load dump current in the regulator is analyzed as shown in FIG. 8. The load dump current $$I_{11} = \frac{14 + 46e^{(-t/120 \, msec.)} - 40 - 10}{100} \, \frac{\text{volts}}{\text{ohms}} \, .$$

from t=0 to t=29 msec. when I=100 ma to 0 ma

Standard low voltage process technology is utilized to fabricate the high voltage devices, e.g. output driver 20, described above. Thus, the P-substrate, N-well and field oxide regions are defined according to conventional MOS process steps. Then, a thick 700 Angstrom gate oxide is grown in areas which have been cleared of field oxide. Selected areas of the thick oxide layer are then masked and etched. A thin oxide layer is then grown in these latter areas to define 400 Angstrom thin gate oxide, 1000 Angstrom gate oxide over those areas not cleared of the 700 Angstrom oxide, and field oxide regions. Standard MOS processing is then used to complete the devices.

It should be understood that various alternatives to the embodiments of the invention described herein may be employed in practicing the invention. It is intended that the following claims define the scope of the invention and that circuit structures within the scope of these claims and their equivalents be covered thereby.

What is claimed is:

1. Power supply load dump protection circuitry for insuring that voltages provided to an operational circuit by a power supply and exceeding a pre-selected voltage are prevented from appearing at an output pad of the operational circuit, the protection circuitry comprising
   an output pad;
   a supply voltage pad connected in series between the power supply and the operational circuit for receiving the supply voltage from the power supply;
   an MOS output pull up transistor of the type that is formed in a semiconductor substrate and comprises source, drain and gate electrodes and wherein the source electrode is connected to the supply pad, the drain electrode is connected to the output pad and the gate electrode is connected to receive an output signal from the operational circuit, the output pull up transistor being constructed to withstand breakdown voltages in excess of the pre-selected voltage between its source and drain and between its source and the semiconductor substrate; and
   detection means connected between the supply pad and the gate of the output pull up transistor for detecting a supply voltage in excess of the preselected voltage and turning off the output pull up transistor in response thereto.

2. Protection circuitry as in claim 1 wherein the detection means comprises
   a switch connected between the source and gate electrodes of the output pull up transistor, and
   a load dump detection latch having an input connected to the supply pad and an output connected to the switch such that when the voltage at the supply pad exceeds the pre-selected voltage, the latch output causes the switch to close.

3. Protection circuitry as in claim 2 wherein the switch comprises an MOS switching transistor having its source connected to the supply pad, its drain connected to the gate of the MOS output pull up transistor and its gate connected to receive the latch output such that the switching transistor turns on when the latch output exceeds the pre-selected voltage.

4. Power supply load dump protection circuitry for insuring that voltages provided to an operational circuit by a power supply and exceeding a pre-selected voltage are prevented from appearing at an output pad of the operational circuit, the protection circuitry comprising:
   an output pad;
   a supply voltaged pad connected in series between the power supply and the operational circuit for receiving the supply voltage from the power supply;
   an MOS output pull up transistor of the type that is formed in a semiconductor substrate and comprises source, drain and gate electrodes and wherein the source electrodes is connected to the supply pad, the drain electrode is connected to the output pad and the gate electrode is connected to receive an output signal from the operational circuit, the output pull up transistor being constructed to withstand breakdown voltages in excess of the preselected voltage between its source and drain and between its source and the semiconductor substrate; and
   detection means connected between the supply pad and the gate of the output pull up transistor for detecting a supply voltage in excess of the preselected voltage and turning off the output pull up transistor in response thereto, the detection means comprising:
   a switch comprising an MOS switching transistor having its source connected to the supply pad, its drain connected to the gate of the MOS output pull up transistor and its gate connected to receive a latch output from a load dump detection latch such that the switching transistor turns on when the latch output exceeds the pre-selected voltage; and
   a load dump detection latch comprising first resistive means connected between the supply pad and a first node, the first node being connected to the gate of the switching transistor to provide a latch output thereto; a first MOS latch transistor having its drain connected to the first node, its source connected to ground and its gate connected to a second node; a second MOS latch transistor having its source connected to the supply pad, its drain connected to the second node and its gate connected to the first node; and second resistive means connected between the second node and ground.

5. Protection circuitry as in claim 23 and further including third resistive means connected between the drain of the switching transistor and ground.

6. Protection circuitry as in claim 5 and further including an MOS output pull down transistor having its drain connected to the output pad, its source connected to ground and its gate connected to receive the output signal from the operational circuit.

7. Power supply load dump protection circuitry for an integrated supply voltage regulator, the protection circuitry comprising a supply voltage pad;

a regulated output voltage pad;

a voltage regulator output driver transistor connected between the supply voltage pad and the regulated output voltage pad for controlling the voltage at the regulated output voltage pad at a predetermined voltage;

means for generating a reference voltage equal to the predetermined voltage;

comparator means connected between the reference voltage means and the regulated voltage output pad for maintaining the predetermined voltage at the same level as the reference voltage; and detection means connected between the supply pad and the voltage regulator output driver transistor for detecting a supply voltage in excess of a pre-selected voltage and turning of the voltage regulator output driver transistor in response thereto.

8. Protection circuitry as in claim 7 and further including a polysilicon resistor connected between the supply pad and the voltage regulator output driver transistor.

9. Protection circuitry as in claim 7 wherein the value of the polysilicon resistor is about 100 ohms.

10. Protection circuitry as in claim 7 wherein the voltage regulator output driver transistor is of the type formed in a semiconductor substrate and comprising source, drain, and gate electrodes and wherein the source electrode is connected to receive a voltage signal from the supply pad, the drain electrode is connected to the regulated voltage output pad and the gate electrode is connected to receive an output signal from the detection means, the voltage regulator output driver transistor being constructed to withstand breakdown voltages in excess of the pre-selected voltage between its source electrode and drain electrode and between its source electrode and the semiconductor substrate.

11. Protection circuitry as in claim 10 wherein the detection means comprises a switch connected between the supply pad and the gate electrode of the voltage regulator output driver transistor; and a load dump detection latch having an input connected to the supply pad and an output connected to the switch such that when the voltage at the supply pad exceeds the pre-selected voltage, the latch output causes the switch to close.

12. Protection circuitry as in claim 11 wherein the switch comprises an MOS switching transistor having its source connected to the supply pad, its drain connected to the gate of the voltage regulator output driver transistor and its gate connected to receive the latch output such that the switching transistor turns on when the latch output exceeds the pre-selected voltage.

13. Power supply load dump protection circuitry for insuring that supply voltages applied to the supply pad of an operational circuit and which exceed a pre-selected voltage level are prevented from damaging the operational circuit and from appearing at an output of the operational circuit, the protection circuitry comprising:

(a) resistive means connected between the supply pad and the remainder of the operational circuit to limit the supply current to the remainder of the operational circuit;

(b) means for preventing the excessive supply voltage from appearing at the output of the operational circuit, the preventive means comprising (i) an MOS output pull up transistor of the type having a source, drain and gate, the source of the output pull-up transistor being connected to the supply pad, its gate being connected to receive an output signal from the operational circuit and its drain being connected to the output pad;

(ii) load dump detection means connected between the source and the gate of the output driver transistor and responsive to the excessive supply voltage to turn off the output driver transistor;

(iii) a resistor connected between the gate of the output pull up transistor and the operational circuit, the load dump detection means being connected between one end of the resistor and the gate of the MOS output pull up transistor; and (iv) an output pulldown transistor of the type having a source, drain and gate, the drain of the pulldown transistor being connected to receive the output signal from the operational circuit, the source of the pulldown transistor being connected to ground and the gate of the pulldown transistor being connected between a second end of the resistor and the operational circuit.

14. Power supply load dump protection circuitry for an integrated supply voltage regulator, the protection circuitry comprising a supply voltage pad;

a regulated output voltage pad;

as voltage regulator output driver transistor connected between the supply voltage pad and the regulated output voltage pad for controlling the voltage at the regulated output voltage pad at a predetermined voltage;

means for generating a reference voltage equal to the predetermined voltage;

comparator means connected between the reference voltage means and the regulated voltage output pad for maintaining the predetermined voltage at the same level as the reference voltage;

detection means connected between the supply pad and the voltage regulator output driver transistor for detecting a supply voltage in excess of a pre-selected voltage and turning off the voltage regulator output driver transistor in response thereto; and wherein the voltage regulator output driver transistor is of the type formed in a semicondcutor substrate and comprising source, drain and gate electrodes and wherein the source electrode is connected to receive a voltage signal from the supply pad, the drain electrode is connected to the regulated voltage output pad and the gate electrode is connected to receive an output signal from the detection means, the voltage regulator output driver transistor being constructed to withstand breakdown voltages in excess of the pre-selected voltage between its source electrode and drain electrode and between its source electrode and the semiconductor substrate; and wherein the detection means comprises a switch connected between the supply pad and the gate electrode of the voltage regulator output driver transistor; and a load dump detection latch having an input connected to the supply pad and an output connected to the switch such that when the voltage at the supply pad exceeds the pre-selected voltage, the latch output causes the switch to close; and wherein the switch comprises an MOS switching transistor having its source connected to the supply pad, its drain connected to the gate of the voltage regulator output driver transistor and its gate connected to receive the latch output such that the switching transistor turns on when the latch output exceeds the pre-selected voltage; and wherein the load dump detection latch comprises first resistive means connected between the supply pad and a first node, the first node being connected to the gate of the switching transistor to provide the latch output thereto;

a first MOS latch transistor having its drain connected to the first node, its source connected to ground and its gate connected to a second node;

a second MOS latch transistor having its drain connected to the supply pad, its source connected to the second node and its gate connected to the first node; and second resistive means connected between the second node and ground.

* * * * *

UNITED STATES PATENT AND TRADEMARK OFFICE
CERTIFICATE OF CORRECTION

PATENT NO. : 4,835,416

DATED : May 30, 1989

INVENTOR(S) : William E. Miller

It is certified that error appears in the above - identified patent and that said Letters Patent is hereby corrected as shown below:

Col. 1, line 42 "$V_{DD}=14+46e^{-t/120}$ msec." should be --$V_{DD}=14+46e^{-t/120}$ msec.--

Col. 7, line 12 after "$V_2$" delete "1".

Col. 7, line 12 "is clamped at" should not be in subscript.

Col. 7, line 13 "BV" should not be in subscript.

Col. 7, line 14 "$BV_{DSSN} + V_{TP}$ 19V" should be --$BV_{DSSN} + V_{TP} \approx 19V$--.

Col. 8, line 5 "$V_{TO}$" should be --$V_{TP}$--.

Col. 8, line 31 "$V_{DS33} > 1V$" should be --$V_{DS33} > -1V$--.

Col. 10, line 19 "voltaged" should be --voltage--.

Col. 10, line 26 "electrodes" should be --electrode--.

Signed and Sealed this

Thirteenth Day of March, 1990

Attest:

JEFFREY M. SAMUELS

*Attesting Officer*  *Acting Commissioner of Patents and Trademarks*